(12) United States Patent
Moll et al.

(10) Patent No.: US 7,495,591 B2
(45) Date of Patent: Feb. 24, 2009

(54) PERFORMING A SIGNAL ANALYSIS BASED ON DIGITAL SAMPLES IN CONJUNCTION WITH ANALOG SAMPLES

(75) Inventors: Joachim Moll, Herrenberg (DE); Heiko Schmitt, Boeblingen (DE); Michael Fleischer-Reumann, Wildberg (DE)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/809,298

(22) Filed: May 31, 2007

(65) Prior Publication Data

US 2008/0001798 A1 Jan. 3, 2008

Related U.S. Application Data

(63) Continuation-in-part of application No. PCT/EP2006/063721, filed on Jun. 30, 2006.

(51) Int. Cl.
*H03M 1/00* (2006.01)

(52) U.S. Cl. .................. 341/123; 314/120; 314/155

(58) Field of Classification Search .................. 341/120, 341/123, 155, 163
See application file for complete search history.

(56) References Cited

U.S. PATENT DOCUMENTS

| | | | |
|---|---|---|---|
| 5,909,186 A * | 6/1999 | Gohringer | 341/120 |
| 6,498,998 B1 * | 12/2002 | Furukawa | 702/117 |
| 6,700,515 B2 * | 3/2004 | Asami | 341/120 |
| 7,023,366 B1 * | 4/2006 | Walker et al. | 341/120 |
| 2002/0030615 A1 * | 3/2002 | Cherubal et al. | 341/120 |
| 2003/0016153 A1 * | 1/2003 | Wang et al. | 341/155 |
| 2005/0219107 A1 * | 10/2005 | Guidry | 341/163 |

* cited by examiner

*Primary Examiner*—Jean B Jeanglaude
(74) *Attorney, Agent, or Firm*—Marc Bobys

(57) ABSTRACT

Testing a device under test—DUT—includes providing a test signal from the DUT to a test probe, taking from the test signal being present at the test probe analog samples at a first sampling rate, taking from the test signal being present at the test probe digital samples at a second sampling rate, providing a control signal indicative of sampling times of the analog samples, and performing an analysis of the digital samples in conjunction with the control signal.

11 Claims, 3 Drawing Sheets

PERFORMING A SIGNAL ANALYSIS BASED ON DIGITAL SAMPLES IN CONJUNCTION WITH ANALOG SAMPLES

This application is a Continuation In Part of International Application No. PCT/EP2006/063721, filed on 30 Jun. 2006, which is incorporated by reference in its entirety.

BACKGROUND

The presently disclosed embodiments relate to testing a device under test—DUT—by performing a signal analysis of a test signal received from the DUT.

For testing a DUT, a data analyzer might be connected to the DUT via a test head. The test head provides an electrical contact to an output of the DUT, captures a test signal from the output, and transmits the captured test signal to an analyzing instrument for further processing. Due to specific requirements of different kinds of data analyzers, usually different test heads are used for different kinds of test instruments and corresponding measurements are typically carried out independently in order to avoid cross disturbances.

Examples for such kinds of test instruments might be represented by a sampling oscilloscope and a BERT. The sampling oscilloscope takes a plurality of analog samples of a received signal for e.g. exactly displaying the waveform of the signal. The analog sample rate might be relatively low with respect to the data rate, whereby the samples or sample values show a high accuracy. By varying the sampling time with respect to the clock pattern and repetitively sampling the signal, the waveform of the signal can be derived. A capturing circuit of a sampling oscilloscope might therefore be optimized for an exact, but slow sampling of periodic signals. Such slow sampling technique is also known as undersampling. An example for a measurement instrument with a sampling oscilloscope is the Agilent 86100C Infiniium digital communication analyzer provided by the applicant Agilent Technologies.

A BERT might be regarded as a fast digital signal analyzer e.g. for determining a logical correctness of the test signal. Thereto, the BERT performs a digital comparison of the test signal with a defined threshold and samples the comparison result typically at the bit rate of the test signal, and determines bit error ratio (BER) values indicative of a ratio of erroneous bits to an overall number of bits. Thus, a capturing circuit for a BERT should be adapted for fast digital sampling, typically at the bit rate of the test signal. Examples for such instruments are serial BERTs of the Agilent N4900 Serial BERT Series, and parallel BERT's based on the Agilent ParBERT 81250 platform, both provided by the applicant Agilent Technologies.

SUMMARY

It is an object of the disclosed embodiments to provide a method and device for an improved testing of a DUT. The object is solved by the independent claims. Further embodiments are shown by the dependent claims.

According to the presently disclosed embodiments, a method for testing a device under test—DUT—comprises:
  providing a test signal from the DUT to a test probe,
  taking from the test signal being present at the test probe analog samples, e.g. multi-bit values, of the test signal at a first sampling rate,
  taking from the test signal being present at the test probe digital samples, e.g. single-bit values, of the test signal at a second sampling rate,
  providing a control signal indicative of sampling times (analog sample generation time points or analog trigger time points respectively) of the analog samples, and
  performing an analysis of the digital samples in conjunction with the control signal.

For taking analog samples, the signal to be analyzed might be provided to a sample&hold circuit. A timing circuit might be provided for generating a first plurality of subsequent trigger pulses in response to a clock signal associated with the test signal. The trigger signals might be provided to a trigger input of the sample&hold circuit. The sample&hold captures the actual physical signal value (e.g. the signal voltage) of the test signal at the trigger time points. The captured values might be provided to an analog-to-digital converter that converts each captured value into a digital multi-bit value. The output of the analog-to-digital converter that can regarded as a sequence of multi-bit values, is provided to the first analyzer. Such multi-bit values are also being referred to as analog samples or analog sample values.

For taking digital samples, the signal to be analyzed might be provided a comparator that compares the signal with a tunable threshold. The digital comparison result might be provided to a sampling flip flop. The sampling flip flop, further receiving a second plurality of subsequent trigger pulses from the timing circuit, might capture each of the actual digital values at each the sampling time. The output of the sampling flip flop that can be regarded as sequence of single bit values or bits, is provided to the second analyzer.

The first data analyzer might be a sampling oscilloscope for performing a waveform analysis of the test signal. The second data analyzer might be a BERT for providing a ratio of a number of erroneous bits to an overall number of bits within a certain time interval. A detection of erroneous bits might be derived from a comparison of the sampled digital values with corresponding expected values. Such expected values might be stored or reproduced within the second data analyzer or might be alternatively received from the signal source.

The second data analyzer therefore performs an evaluation of received digital samples in conjunction with the control signal, e.g. by masking such digital samples that have been taken simultaneously with analog samples, or within certain time frames with respect to the analog samples.

The second sampling rate is typically significantly higher than the first sampling rate. Typically the second sampling rate equals the data rate of the test signal (typically up to several Giga bits per second (Gbs), whereas the first sampling rate may be about or less than 100 kilo bits per second (kbs) in case of a typical sampling oscilloscope.

The control signal provides information of collisions or potential collisions of the sampling circuits. Such collisions might be effected by current spikes that initiate an analog sampling for switching a diode sampling circuitry. The current spikes might influence contemporaneous digital sampling values for the BERT analysis. As much fewer analog samples are taken compared to digital samples, only a few digital samples are influenced; however even a distortion of a very small number of digital samples leads to intolerable errors within the BERT analysis.

The control signal concept allows for handling potential collisions a logical level, e.g. within the data analyzers; in other words, the embodiments allow for logically decoupling electrically coupled analyzing devices. This allows for electrically coupling the sampling circuitries for capturing the analog and digital data from the test signal. Such circuitry might be integrated into one common test head that might further comprise a test probe for providing the electrical connection to the DUT output.

As the cross influence of the different sampling circuits is mitigated for on the logical level within the corresponding data analyzers, electrical cross influence within the circuitry of the common test can be tolerated. This allows for providing a compact and cost effective solution. Further, the embodiments allow for significantly reducing the test time, as the different tests might be performed in parallel.

According to at least one embodiment, a process switching of the processing within the second data analyzer is carried out in response to the control signal.

According to a further embodiment, switching the processing of the digital samples may comprise ignoring digital samples or replacing the digital samples. Ignoring means that ignored digital samples are not taken into account for processing the digital samples. Replacing digital samples means replacing digital samples by predefined samples, e.g. taken from expected data.

Alternatively to ignoring or replacing single digital sample values, a certain number of consecutive digital sample values around or adjacent to an affected digital sample value (or within a certain time window) might be ignored or replaced. E.g. a BERT might comprise a multiplexer for multiplexing a certain number of serially received digital sample values into a word in order to provide a parallel processing. Thus, a corresponding number of consecutive bits forming an entire word, for example 64 or 128 bits, might be replaced or ignored.

According to another embodiment, the control signal is generated in the first data analyzer that transmits said control signal to the second data analyzer. Alternatively, the control signal is generated in the test head and transmitted to the second data analyzer. An advantage of the first alternative is that the test head may not be involved in the generation and transmission of the control signal. An advantage of the second alternative is that no direct connection for transmitting the control signal from the first to the second data analyzer is required.

According to a further embodiment, the first data analyzer may be part of or associated with a sampling oscilloscope e.g. for digitally determining an eye diagram, and the second data analyzer may be part of or associated with a bit error rate tester—BERT e.g. for determining a value indicative of the logical correctness of the test signal.

According to another embodiment, a sampling circuitry for testing a DUT is provided, wherein the circuitry comprises: an analog sampling circuitry comprising a series connection of two PN diodes, wherein each PN diode is connected to a controllable current source, a current switch for the switching of current sources for initiating or activating the process of taking an analog sampling value of the input signal from the DUT, a digital sampling circuitry comprising a comparator for comparing an input voltage with a threshold voltage and a clocked Flip-Flop connected to the comparator output for clocking the comparator output signal, wherein the input of the digital sampling circuitry and the input of the analog sampling circuitry are connected and the sampling control unit is further adapted for generating a control signal for controlling the processing of digital samples taken by the digital sampling circuitry in a data analyzer receiving the digital samples.

According to a further embodiment, in the analog sampling circuitry the current sources and the PN diode may be connected to a capacitor to intermediate store voltage values representing the analog samples.

According to a further embodiment, in the analog sampling circuitry the connection of a current source and a PN diode may be connected to an analog-to-digital converter for converting the voltage stored in the capacitor into (multi-bit) digital values.

According to an embodiment, the digital sampling circuitry may further comprise a clock recovery circuit provided for recovering a clock for the Flip-Flop from the input signal from the DUT.

The disclosed embodiments can be partly or entirely embodied or supported by one or more suitable software programs, embodied on a computer readable medium, and which might be executed in or by any suitable data processing unit. For example, controlling the provision of the digital samples to the second data analyzer depending on a control signal may be implemented as a program which may include one or more algorithms, embodied on a computer readable medium, which may be executed by a microcontroller.

BRIEF DESCRIPTION OF DRAWINGS

Other objects and many of the attendant advantages of the disclosed embodiments will be readily appreciated and become better understood by reference to the following more detailed description in connection with the accompanied drawings. Features that are substantially or functionally equal or similar will be referred to by the same reference signs.

DETAILED DESCRIPTION

Figure 1:
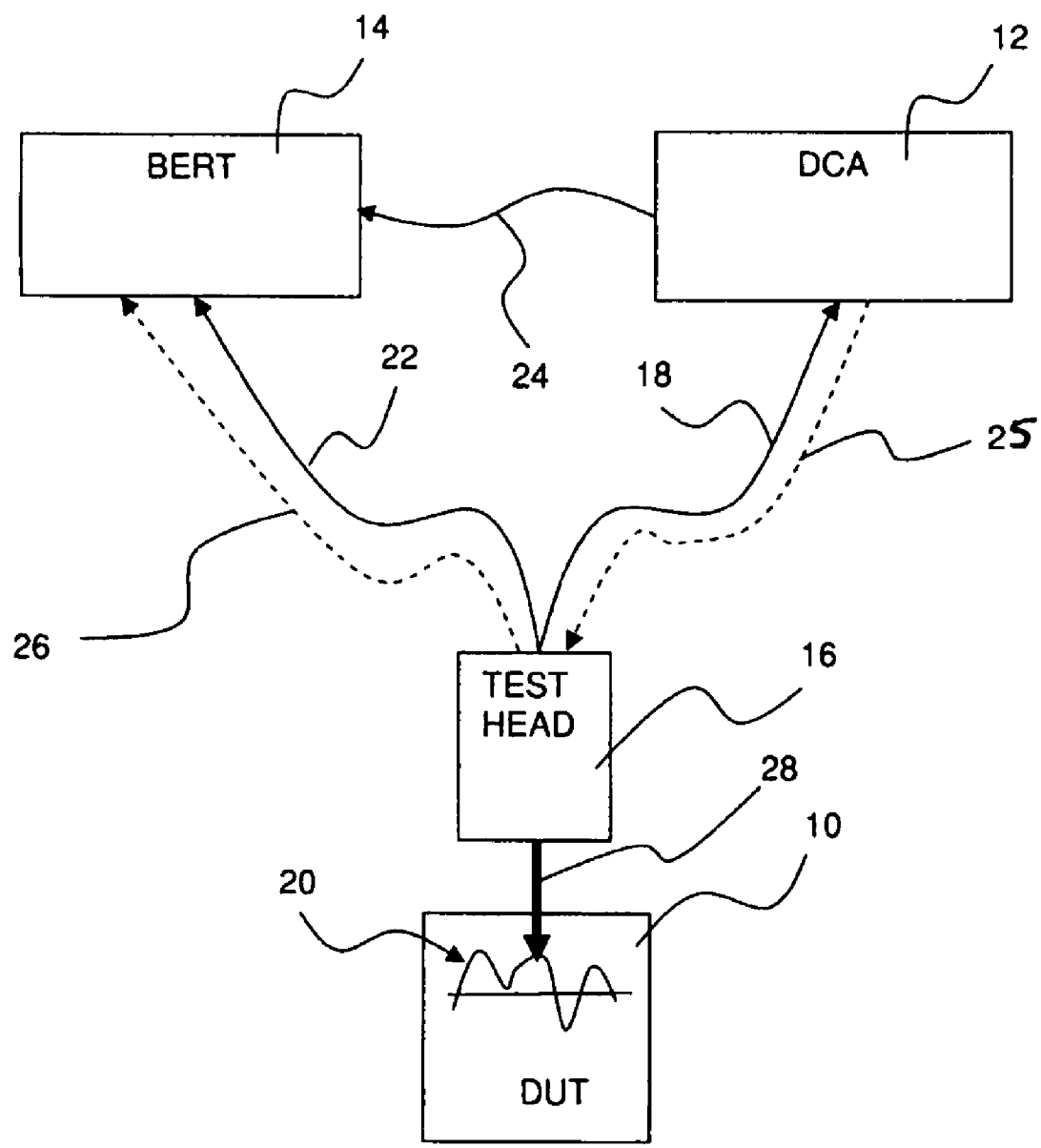
FIG. 1 shows a block diagram of an embodiment of a device for testing a DUT with a sampling oscilloscope and A BERT by using a common test head according to the disclosed embodiments.

FIG. 1 shows a DUT 10, for example a high-speed digital communication system or device, a digital sampling oscilloscope 12 for digitally measuring and analyzing the course or waveform of a signal 20 of the DUT, a BERT (analyzer) 14 for determining the bit error rate of the signal 20, and a test head 16 for capturing data from a test signal 20. The test head 16 comprises a probe 28 which is electrically connectable to a test point, a pin or a wire line representing an output of the DUT 10 for capturing physical information of the signal 20.

The test head 16 takes analog samples of the signal 20 at a first sampling rate. For example the first sampling rate may be 10000 times lower than the second sampling rate. The test head 16 transmits an analog sampling signal 18 comprising a sequence of the analog samples 18 to the sampling oscilloscope 12 for further processing. The test head 16 further takes digital samples, at a second sampling rate e.g. similar to the bit rate of the test signal 20, and transmits a digital sampling signal 22 comprising a sequence of the digital samples to the BERT 14.

For taking the digital samples, a clock recovery might be performed from the received test signal 20. Alternatively, a separate clock signal (not shown) might be used for sampling. Due to the high second sampling rate, the digital sampling requires a high bandwidth. For the digital sampling as performed within a BERT, the sensitivity should be sufficiently high, since the high-speed signal 20 is sampled with at high sampling rates. However, due to the fact that the magnitude of the sampling pulses of the analog sampling is in the same range compared to the signal to be measured, the digital sampling is influenced by the analog sampling. Such influence might lead to a wrong digital comparison result that might lead to wrong BER results.

In order to avoid bit error ratio analysis errors in the BERT 14 caused by such interference due to the analog sampling, a first control signal 24 is transmitted from the sampling oscilloscope 12 to the BERT 14. In this case, the BERT 14 itself controls the processing of the digital samples 22 provided by the test head 16 using the first control signal 24. This alternative might be preferable, if the test head is part of the sampling oscilloscope 12.

Alternatively, a corresponding second control signal 26 is generated by the test head 16 and transmitted from the test head 16 to the BERT 14. In order to further control the provision of digital samples form the test head 16 to the BERT 14, a third control signal 25 might be provided from the sampling oscilloscope 12 to the test head 16.

Alternatively, the test head 16 provides a composed signal to the BERT 14, comprising the digital samples and control information of the control signal.

The control signals 24 or 26 are indicative of sampling times of the analog samples. Thereto, the control signals might be digital signal, e.g. having a lower bit rate compared to the digital sampling signal 22. The control signal might show a logical 1 when an analog sampling is activated and a logical 0 otherwise, or vice versa. A logical "1" of the control signal activates a switching process within the BERT 14; in other words, the control signal control a switching of the processing of the digital samples in the BERT 14.

The switching of the processing in the BERT 14 results in ignoring the digital samples in the BERT 14 or replacing the digital samples by predefined sampling values. When ignoring or replacing the digital samples, the BERT 14 replaces either entire words such as 128 bits or several consecutive bits of the received stream of bits representing the digital samples taken by the test head 16.

Figure 2:
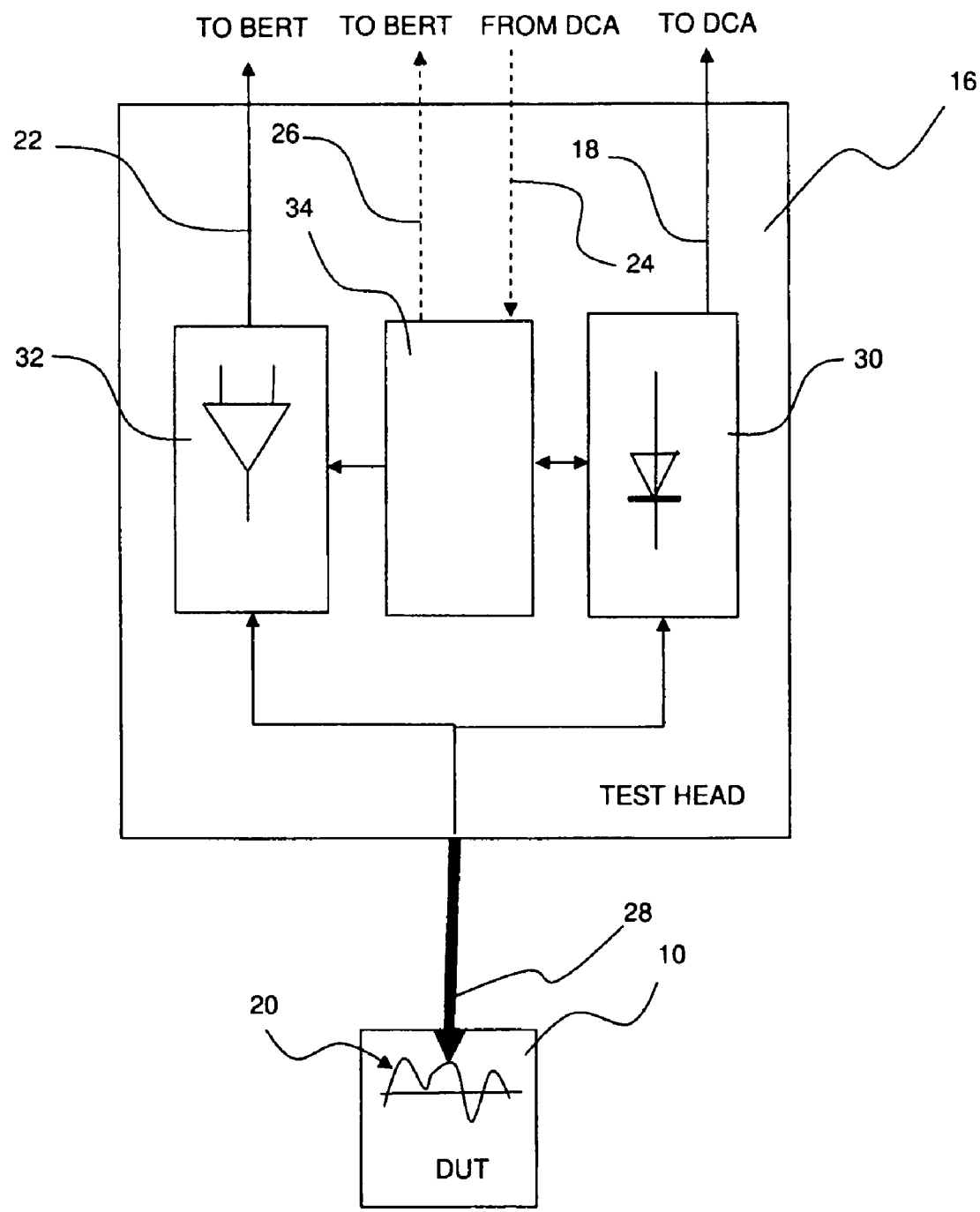
FIG. 2 shows a block diagram of an exemplary test head according to the disclosed embodiments.

FIG. 2 shows the embodiment of a test head 16 in more detail. The test head 16 comprises an analog sampling circuitry 30, which is a diode sampling circuitry clocked at an analog sampling rate which is relatively low in the range of several kHz, and a digital sampling circuitry 32, which comprises a comparator for comparing the captured signal 20 with a threshold at the digital sampling rate. Furthermore, the test head 16 comprises a control circuit 34. The unit 34 serves for providing the control signal to be provided in conjunction with the digital samples 22 to the BERT 14 as will be explained in the following.

The control circuit 34 receives a control signal 24 from the sampling oscilloscope 12 when an analog sample is taken, or when a sampling pulse should be generated in the analog sampling circuitry 30 in order to take an analog sample 18. Alternatively, the control circuit 34 may also receive a control signal directly from the analog sampling circuitry 30 when an analog sample 18 is taken. Upon receipt of a control signal either from the sampling oscilloscope 12 or the analog sampling circuitry 30, the control circuit 34 generates and transmits a control signal 26 to the BERT 14 in order to control the processing of the digital samples 22 in the BERT 12. The control signal 26 causes the BERT 14 to switch the processing of the digital samples 22, as described above.

Figure 3:
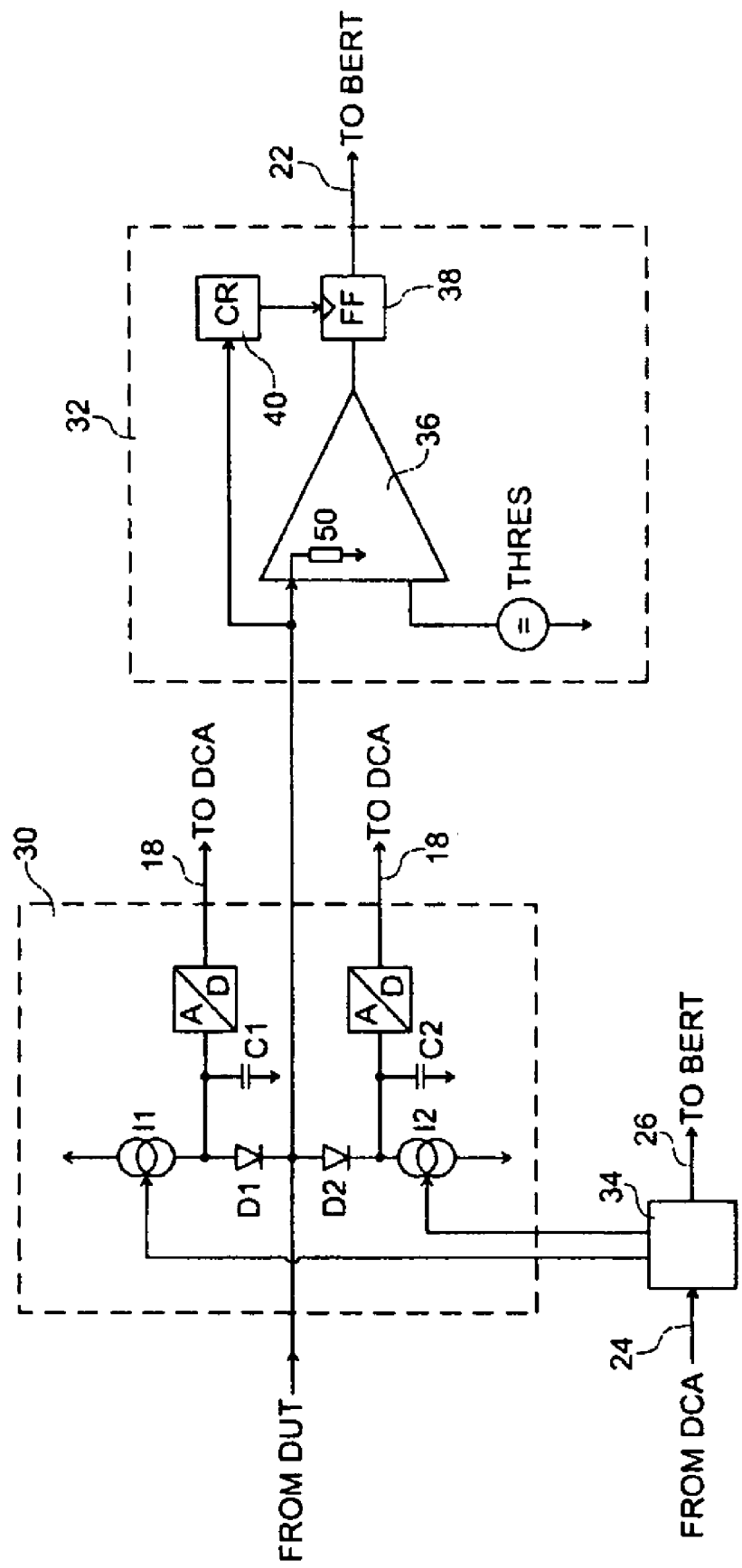
FIG. 3 shows exemplary circuitry of the test head according to the disclosed embodiments.

FIG. 3 shows details of exemplary sampling circuitries 30 and 32 which are connected at their inputs. The analog sampling circuitry 30 comprises a diode sampling circuitry. The diode sampling circuitry comprises two PN diodes D1 and D2 connected in series. The diode D1 is supplied at its positive connection with a current from a controlled current source I1. The diode D2 is supplied at its negative connection with a current from a controlled current source I2. The current sources I1 and I2 are controlled by the control circuit 34. The control unit 34 controls the current sources I1 and I2 such that for taking a sample the current sources I1 and I2 are switched such that a current may flow over the diodes D1 and D2. The intensity of the flowing current depends on the voltage at the connection of the two diodes D1 and D2. The voltage at the connection point is influenced by the signal from the DUT. The flowing current charges or discharges the capacitances C1 and C2. Therefore, the charges on the capacitances C1 and C2 represent the analog sample of the signal from the DUT taken at the time when the current sources I1 and I2 are switched on by the control unit 34. The charges on the capacitances C1 and C2 are converted by Analog to Digital (A/D) converters into digital values which are transmitted to the sampling oscilloscope as digital signals 18 for further processing.

The control circuit 34 receives the control signal 24 from the sampling oscilloscope as mentioned above. This control signal 24 is provided for generating the switching signals for the current sources I1 and I2. When the current sources I1 and I2 are switched on, a current spike occurs on the input of the digital and the analog sampling circuitry 30 and 32, respectively. Because the magnitude of the current spikes are in the range of the amplitude of the signal to be measured, this current spike significantly influences the digital sampling by the digital sampling circuitry 32, and, thus, may cause erroneous digital samples. In order to avoid a processing of these erroneous digital samples in the BERT, the control unit 34 generates the control signal 26 already mentioned above. This control signal 26 may be for example a digital signal which is activated when a analog sample is taken, i.e. the switching signals for the current sources I1 and I2 are generated. The control signal 26 is processed in the BERT and used for switching the processing of the digital samples 22 received by the BERT from the digital sampling circuitry 32.

The digital sampling circuitry 32 comprises a comparator 36. The signal from the DUT is guided to an input of the comparator 36 with an input impedance of 50 ohms matching the impedance of a typical connection line to the DUT and, therefore, avoiding reflections on the connection line which could influence the sampling. The other input of the comparator 36 is connected to a voltage source THRES generating a threshold voltage with which the input voltage from the DUT is compared. At its output, the comparator 36 generates a comparison signal of the two input voltages. This comparison signal is input to a Flip-flop 38 which is clocked with the data rate of the signal from the DUT. In order to generate the clock for the Flip-Flop 38, a clock recovery circuit 40 is provided which receives the signal from the DUT and generates a clock from this signal. The digital samples 22 of the signal from the DUT at the output of the Flip-Flop 38 are then transmitted to the BERT for further processing.

The disclosed embodiments allow for efficiently performing data analyses based on analog and digital samples by using a common test head for capturing the samples from the test signal. Furthermore, the embodiments allow for the performance of parallel measurements of the test signal, thereby mitigating the problem of electrical coupling effects between the digital sampling circuitry and the analog sampling circuitry on a logical level. This allows further integrating both the digital sampling circuitry and the analog sampling circuitry

The invention claimed is:

1. A method for testing a device under test—DUT—comprising:

providing a test signal from the DUT to a test probe, taking analog samples from the test signal being present at the test probe at a first sampling rate, taking digital samples from the test signal being present at the test probe at a second sampling rate, providing a control signal indicative of sampling times of the analog samples, the control signal being sent by a control circuit, performing an analysis of the digital samples in conjunction with the control signal, and wherein taking the analog samples is done by an analog sampling circuitry, the analog sampling circuitry comprising a series connection of two diodes, wherein each diode is connected to a controllable current source, the control circuit is controlling the switching of the controllable current sources of the analog sampling circuitry in order to capture the analog samples of the test signal from the DUT, and wherein a capacitance is provided for storing the analog samples.

2. The method of claim 1, wherein the control signal comprises an indication of selected samples of the digital samples having a certain time relation with respect to the analog samples, and wherein performing the analysis of the digital samples is carried out such that the selected samples does not have any effect to an analysis result.

3. The method of claim 2, wherein the selected samples of the digital samples are determined having same sampling times or sampling times falling within certain time windows around sampling times of the analog samples.

4. The method of claim 1, wherein the test result comprises a bit error ratio value indicative of a ratio of erroneous samples of the digital samples except the selected samples to an overall number of evaluated samples.

5. The method of claim 1, the selected samples are one of: ignored, masked or replacing by predefined samples.

6. The method of claim 1, wherein the analog samples are converted into multi-bit values by performing an analog-to-digital conversion.

7. The method of claim 6, wherein the analog samples are provided to a first data analyzer for performing a waveform analysis, and wherein the digital samples and the control signal are provided to a second data analyzer for performing a bit error ratio analysis.

8. The method of claim 6, wherein the second data analyzer performs a process switching in response to the control signal comprising one of: ignoring selected samples, masking selected samples, or replacing selected samples with a predefined sample values.

9. The method of claim 1, wherein the digital samples and the control signal are provided as digital signals, and wherein the bits of the control signal have a first value if corresponding digital samples are to be processed and have a second value otherwise.

10. A test head for testing a device under test—DUT—, comprising a test probe adapted to be electrically connected to the DUT, an analog sampling circuitry adapted to take analog samples of a signal at a first sampling rate, a digital sampling circuitry adapted to take digital samples of the signal at a second sampling rate, a control circuit adapted to provide a control signal indicative of a timing of the analog samples, wherein the analog sampling circuitry comprises a series connection of two diodes, wherein each diode is connected to a controllable current source, the control circuit is controlling the switching of the current sources of the analog sampling circuitry in order to capture the analog samples of the signal from the DUT, and wherein a capacitance is provided for storing the analog samples.

11. The sampling circuitry of claim 10, wherein the analog sampling circuitry comprises an analog-to-digital converter for converting the analog sample into multi-bit digital values.

* * * * *